(12) United States Patent
Sakui et al.

(10) Patent No.: US 9,472,287 B2
(45) Date of Patent: *Oct. 18, 2016

(54) LOCAL SELF-BOOST USING A PLURALITY OF CUT-OFF CELLS ON A SINGLE SIDE OF A STRING OF MEMORY CELLS

(71) Applicant: MICRON TECHNOLOGY, INC., Boise, ID (US)

(72) Inventors: Koji Sakui, Tokyo (JP); Yasushi Matsuyama, Yokohama (JP); Ryan G. Fisher, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 120 days.

This patent is subject to a terminal disclaimer.

(21) Appl. No.: 14/475,828

(22) Filed: Sep. 3, 2014

(65) Prior Publication Data
US 2014/0369130 A1 Dec. 18, 2014

Related U.S. Application Data

(63) Continuation of application No. 13/413,762, filed on Mar. 7, 2012, now Pat. No. 8,830,775.

(51) Int. Cl.
*G11C 16/04* (2006.01)
*G11C 16/10* (2006.01)
*G11C 16/34* (2006.01)

(52) U.S. Cl.
CPC ........... *G11C 16/10* (2013.01); *G11C 16/0483* (2013.01); *G11C 16/3427* (2013.01)

(58) Field of Classification Search
CPC .................................................. G11C 16/0483
USPC ..................................................... 365/210.12
See application file for complete search history.

(56) References Cited

U.S. PATENT DOCUMENTS

| | | | |
|---|---|---|---|
| 7,292,476 B2 | 11/2007 | Goda et al. | |
| 7,508,711 B2 | 3/2009 | Goda | |
| 8,830,775 B2 * | 9/2014 | Sakui et al. | 365/210.12 |
| 2005/0105359 A1 * | 5/2005 | Matsunaga | 365/222 |
| 2008/0008006 A1 | 1/2008 | Goda et al. | |
| 2010/0054036 A1 | 3/2010 | Lee et al. | |
| 2010/0115325 A1 | 5/2010 | Lin | |
| 2010/0165733 A1 | 7/2010 | Nakamura et al. | |
| 2010/0246268 A1 * | 9/2010 | Lee et al. | 365/185.18 |
| 2010/0259992 A1 * | 10/2010 | Santin et al. | 365/185.18 |
| 2010/0296344 A1 | 11/2010 | Kim et al. | |
| 2011/0103154 A1 | 5/2011 | Cho et al. | |
| 2012/0294087 A1 * | 11/2012 | Seo et al. | 365/185.18 |

* cited by examiner

*Primary Examiner* — Min Huang
(74) *Attorney, Agent, or Firm* — Dicke, Billig & Czaja, PLLC (57) ABSTRACT

Methods for local self-boost of a selected memory cell channel, memory devices, and systems are disclosed. One such method generates a cut-off channel under each of a plurality of memory cells on one of either a source side or a drain side of a selected memory cell.

20 Claims, 6 Drawing Sheets

LOCAL SELF-BOOST USING A PLURALITY OF CUT-OFF CELLS ON A SINGLE SIDE OF A STRING OF MEMORY CELLS

RELATED APPLICATION

This Application is a Continuation of U.S. application Ser. No. 13/413,762, titled "LOCAL SELF-BOOST USING A PLURALITY OF CUT-OFF CELLS ON A SINGLE SIDE OF A STRING OF MEMORY CELLS," filed Mar. 7, 2012, now U.S. Pat No. 8,830,775 issued Sep. 9, 2014, which is commonly assigned and incorporated herein by reference.

TECHNICAL FIELD

The present embodiments relate generally to memory and a particular embodiment relates to reducing leakage current in a memory device.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Figure 1:
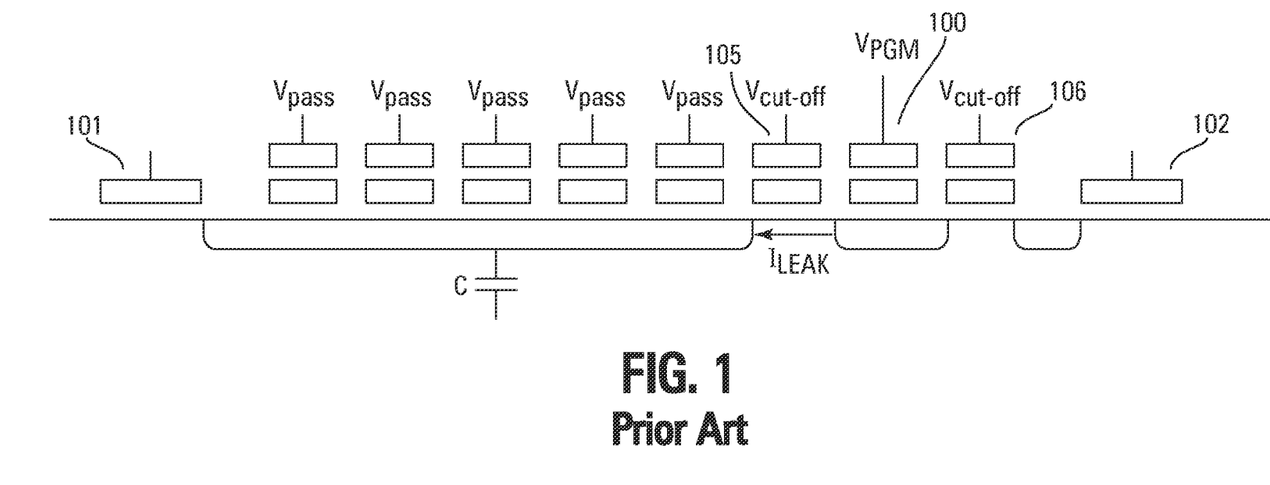
FIG. 1 shows a cross-sectional view of a typical prior art program inhibit operation of a memory cell in a series string of memory cells.

FIG. 1 illustrates a typical prior art programming operation for a memory cell in a series string of memory cells of a NAND architecture memory device. The memory cells of the series string are coupled in series drain-to-source. A source-side of the series string is coupled to a source line through a select gate source transistor 101. A drain-side of the series string is coupled to a bit line through a select gate drain transistor 102.

The control gate of a selected memory cell 100 is biased at $V_{pgm}$ as a cell having a control gate that is commonly coupled with the selected memory cell is being biased at $V_{pgm}$ to program that particular memory cell. The control gates of memory cells 105, 106 on either side of and adjacent to the selected memory cell 100 are biased at a cut-off voltage (e.g., $V_{SS}$) so that these memory cells are turned off to act as cut-off memory cells that provide a local self-boost. The control gates of the remaining transistors of the series string are biased at a $V_{pass}$ voltage that enables these memory cells to act in a pass through mode.

One problem with this programming inhibiting is that when a series string comprises a large number of erased memory cells between the selected memory cell and the select gate source, a large capacitance C exists in the channel of the source-side memory cells. The large capacitance causes a leakage current ($I_{LEAK}$) from the selected memory cell channel to the large capacitance C. The leakage current can reduce the voltage of the channel of the cell 100 being program inhibited, thus increasing the possibility of programming errors.

For the reasons stated above and for other reasons that will become apparent to those skilled in the art upon reading and understanding the present specification, there is a need in the art for a reducing source-side channel capacitance in a string of memory cells.

DETAILED DESCRIPTION

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
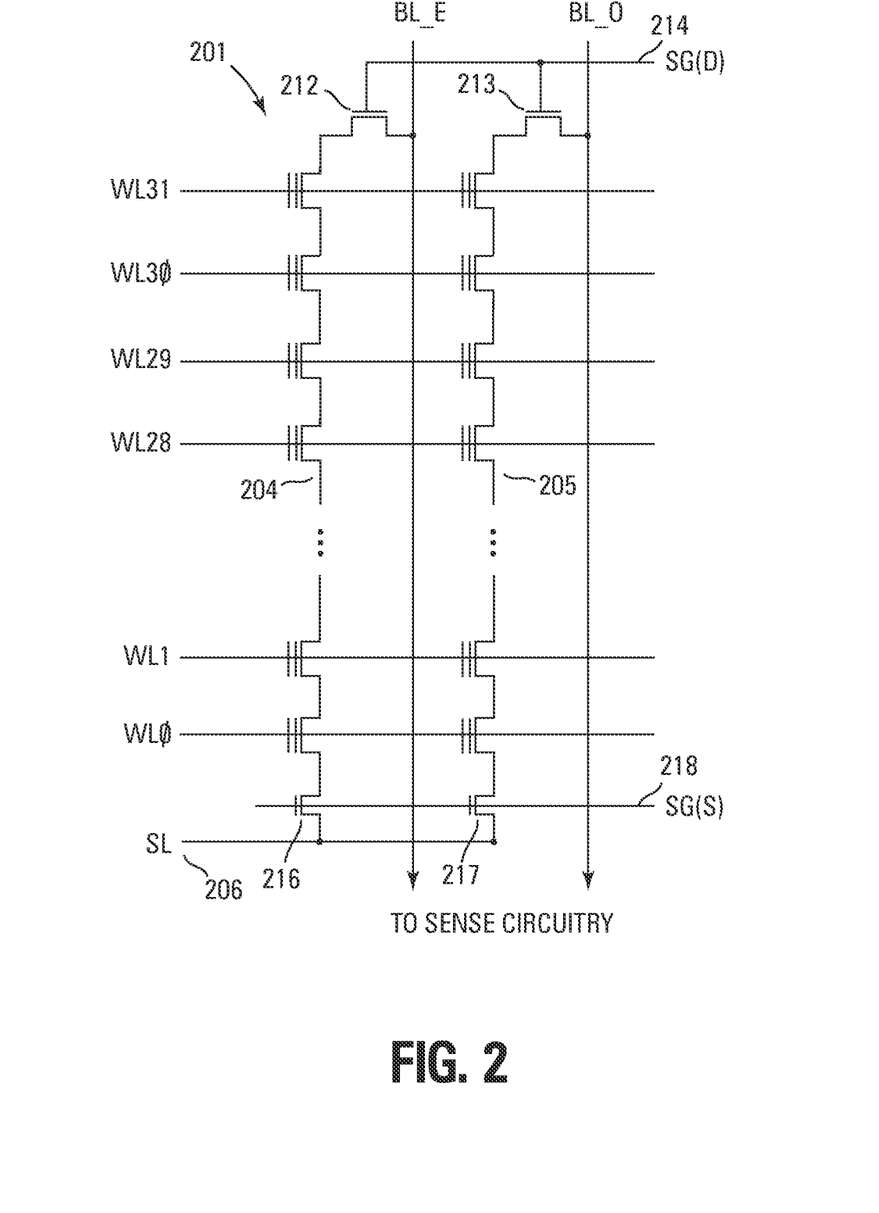
FIG. 2 shows a schematic diagram of one embodiment of a portion of a NAND architecture memory array.

FIG. 2 illustrates a schematic diagram of one embodiment of a portion of a NAND architecture memory array 201 comprising series strings of non-volatile memory cells. The present embodiments of the memory array are not limited to the illustrated NAND architecture.

The memory array 201 comprises an array of non-volatile memory cells (e.g., floating gate) arranged in columns such as series strings 204, 205. Each of the cells is coupled drain to source in each series string 204, 205. An access line (e.g., word line) WL0-WL31 that spans across multiple series strings 204, 205 is coupled to the control gates of each memory cell in a row in order to bias the control gates of the memory cells in the row. Data lines, such as even/odd bit lines BL_E, BL_O, are coupled to the series strings and eventually coupled to sense circuitry that detects the state of each cell by sensing current or voltage on a selected bit line.

Each series string 204, 205 of memory cells is coupled to a source line 206 by a source select gate 216, 217 (e.g., transistor) and to an individual bit line BL_E, BL_O by a drain select gate 212, 213 (e.g., transistor). The source select gates 216, 217 are controlled by a source select gate control line SG(S) 218 coupled to their control gates. The drain select gates 212, 213 are controlled by a drain select gate control line SG(D) 214.

In a typical programming of the memory array, the memory cells can be programmed as either single level cell (SLC) memory or multiple level cell (MLC) memory. The cell's threshold voltage ($V_t$) is an indication of the data stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multiple level cells can take advantage of the analog nature of a traditional flash cell by assigning a bit pattern to a specific $V_t$ range.

Figure 3:
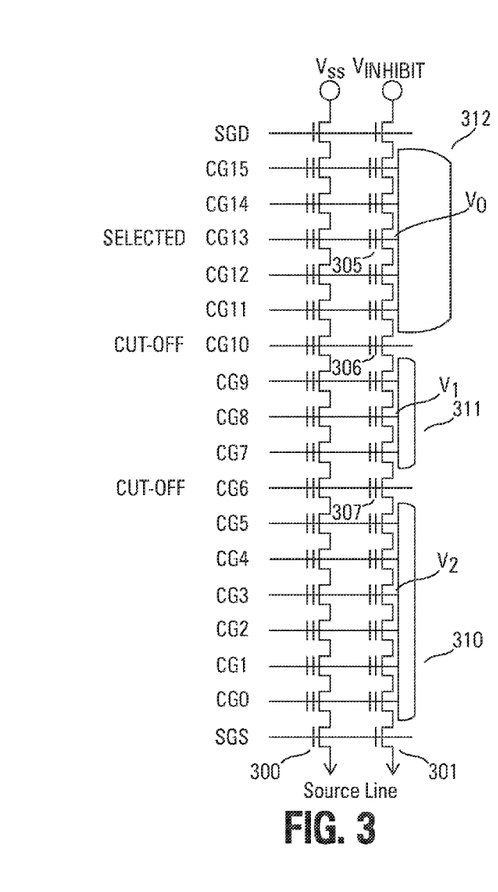
FIG. 3 shows a combination schematic and cross-sectional view of one embodiment of a series string that employs two cut-off cells on a single side of a selected cell during self-boost.

FIG. 3 illustrates a combination schematic diagram and cross-sectional view of one embodiment of a pair of NAND architecture series strings, such as illustrated in FIG. 2. This embodiment uses at least two cut-off cells on a single side of a selected cell to reduce the local channel capacitance near the selected local channel on the source-side of the selected memory cell 305. The cross-sectional view also shows representations of the channel capacitance 310-312 that results from using the at least two cut-off cells during program inhibit. One series string of memory cells 300 is shown as being inhibited while the other series string of memory cells 301 is being programmed.

In one embodiment, a series string of memory cells 301 coupled to the inhibited bit line can be inhibited from programming by biasing the bit line with an inhibit voltage $V_{INHIBIT}$ (e.g., $V_{CC}$). A series string of memory cells 300 coupled to the bit line being programmed can be enabled for programming by biasing the bit line with a relatively low voltage (e.g., $V_{SS}$, 0V). The programming speed of the memory cells coupled to the bit line can be decreased by increasing the bit line voltage.

FIG. 3 further illustrates the control gates CG0-CG15 of the memory cells that are biased with a voltage appropriate for the operation being performed on that particular memory cell. For example, the selected memory cell 305 being program inhibited would be biased at $V_{PGM}$ during the programming operation. In one embodiment, the control gates of each of the memory cells in a row of memory cells are coupled to a respective word line (WL0-WL15), as illustrated in FIG. 2. While 16 rows of memory cells are illustrated in FIG. 3, one skilled in the art would realize that local self-boost using at least two cut-off memory cells on a single side of a selected memory cell 305, as subsequently described, works for other quantities of memory cells in a series string (e.g., 32, 64, 128).

Reference is made to the timing diagram of FIG. 4 while subsequently describing program inhibiting using at least two cut-off memory cells on a source side of the selected memory cell. The program inhibit operation describes inhibiting the programming of the selected memory cell 305 coupled to control gate CG13. This is for purposes of illustration only as the present embodiments are not limited to inhibiting programming of any one memory cell.

Figure 4:
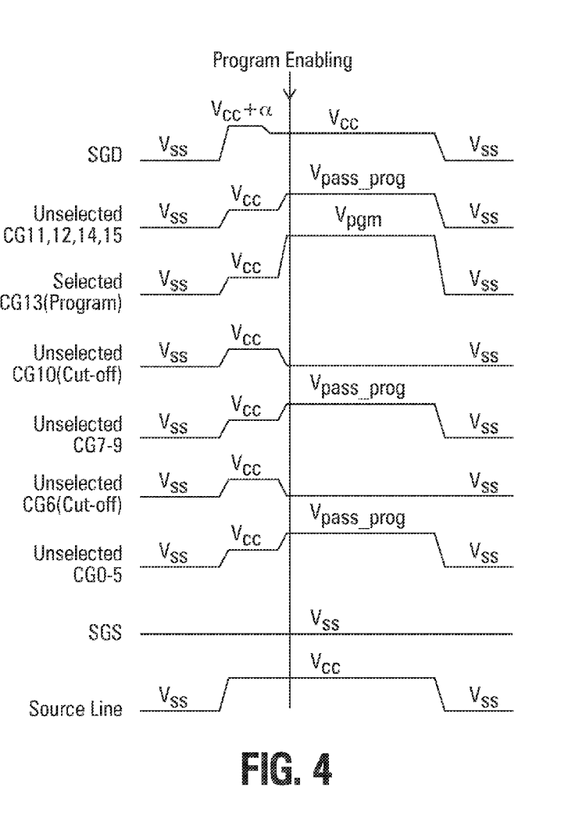
FIG. 4 shows one embodiment of a timing diagram in accordance with the embodiment of FIG. 3.

As illustrated in FIG. 4, the control gates CG0-CG15 are initially at $V_{SS}$ prior to the programming operation. The control gate bias as well as the source line are then increased to a supply voltage (e.g., $V_{CC}$). The source select gate (SGS) control line remains at $V_{SS}$. The select gate drain (SGD) line is biased at the supply voltage plus a voltage offset α just prior to the program enabling.

At the time of program enabling, the control gate for the selected memory cell 305 is biased at $V_{PGM}$ while the source line and the SGD line are biased at the supply voltage (e.g., $V_{CC}$). Control gates CG11, 12, 14, 15 coupled to unselected memory cells are biased at a program pass voltage $V_{pass\_prog}$. Similarly, control gates CG7-9 and CG0-5 coupled to unselected memory cells are also biased at the program pass voltage. The program pass voltage turns the memory cells on enough to act in a pass through mode.

At least two cut-off memory cells 306, 307 are used on the source-side of the selected memory cell 305 between the selected memory cell 305 and the source line to provide the local self-boost to the selected memory cell's 305 local channel. The control gates CG6 and CG10 that are coupled to the cut-off memory cells 306, 307 are biased at a cut-off voltage (e.g., $V_{SS}$) so that these memory cells 306, 307 are inhibited (e.g., turned off) during the programming operation. The channels of the cut-off memory cells 306, 307 are cut-off regions that act to reduce the capacitance on the source-side of the series string that is closest to the selected memory cell 305 by splitting the total capacitance into smaller areas with the cut-off channels between the smaller areas. This has the effect of boosting the local channel voltage $V_0$ of the selected memory cell channel to be greater than both unselected memory cell channel voltages $V_1$ and $V_2$. Thus, $V_0 > V_1 > V_2$ so that the leakage current is reduced from the prior art.

As shown in FIG. 3, the indication of the channel capacitance 312 resulting from the relatively large programming voltage on the selected memory cell 305 shows a relatively large channel capacitance 312. The unselected, source-side memory cells have a relatively low channel capacitance but a large quantity of unselected, erased memory cells between the selected memory cell and the source line would add up to a larger total capacitance that could cause a leakage current from the selected memory cell channel to the unselected memory cells channel. The second cut-off memory cell 307 reduces the total capacitance that is adjacent to the selected memory cell channel 312 to just the channel capacitance 311 under the three unselected memory cells coupled to control gates CG7-9. The remaining channel capacitance 310 does not have an appreciable affect on the selected memory cell 305 due to its distance from the selected memory cell 305.

Figure 5:
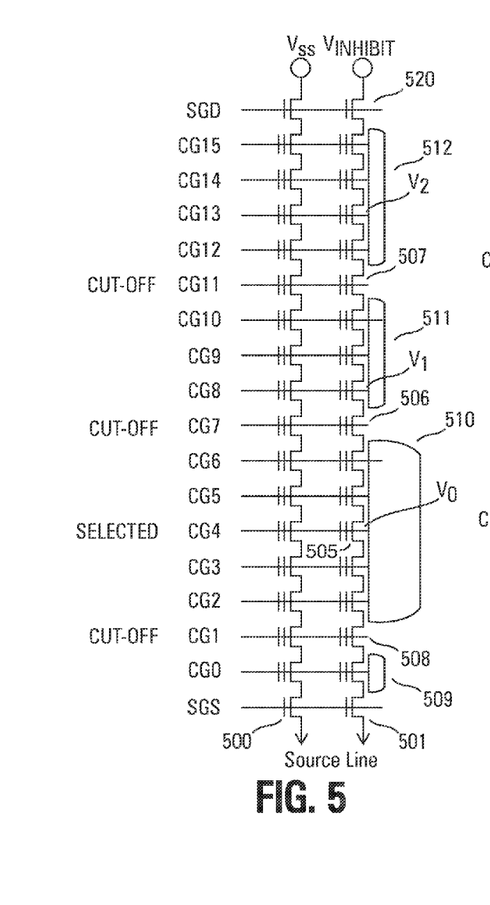
FIG. 5 shows a combination schematic and cross-sectional view of an alternate embodiment of a series string that employs two cut-off cells on a single side of a selected cell during self-boost.

FIG. 5 illustrates a combination schematic diagram and cross-sectional view of an alternate embodiment of a pair of NAND architecture series strings, such as illustrated in FIG. 2. This embodiment uses at least two cut-off memory cells on a drain side of the selected memory cell to reduce the local channel capacitance near the selected local channel on the drain-side of the selected memory cell 505.

Using at least two cut-off memory cells on the drain side of the selected memory cell can reduce the likelihood of discharging the otherwise boosted channel voltage of the selected memory cell's local channel, thus reducing the possibility of programming errors. Since a string of memory cells is typically programmed from the word line closest to the source line to the word line closest to the bit line, the memory cells between the selected memory cell and the select gate drain transistor 520 will typically be erased. This can result in a significant amount of capacitance on the drain-side of the selected memory cell 505. As in using at least two cut-off memory cells on a source side of a selected memory cell, using at least two-cut-off memory cells on the drain-side breaks up the large capacitance so that the total capacitance immediately adjacent to the selected memory cell's local channel is reduced. This has the effect of boosting the local channel voltage $V_0$ of the selected memory cell channel to be greater than both unselected memory cell channel voltages $V_1$ and $V_2$. Thus, $V_0 > V_1 > V_2$.

The cross-sectional view shows representations of the channel capacitance 509-512 that results from using at least two cut-off memory cells during program inhibit. One series string of memory cells 501 is shown as being inhibited while the other series string of memory cells 500 is being programmed.

Reference is made to the timing diagram of FIG. 6 while subsequently describing program inhibiting memory cell 505 of FIG. 5 using at least two cut-off memory cells on a drain side of selected memory cell 505. The programming operation describes the programming of the selected memory cell 505 coupled to control gate CG4. This is for purposes of illustration only as the present embodiments are not limited to program inhibiting any one memory cell.

Figure 6:
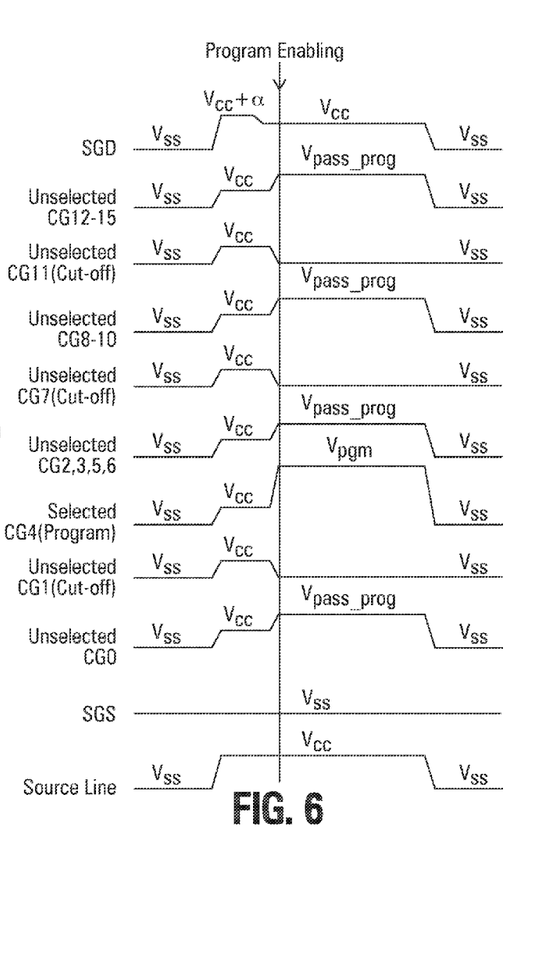
FIG. 6 shows one embodiment of a timing diagram in accordance with the embodiment of FIG. 3.

As illustrated in FIG. 6, the control gates CG0-CG15 are initially at $V_{SS}$ prior to the programming operation. The control gate bias as well as the source are then increased to a supply voltage (e.g., $V_{CC}$). The source select gate (SGS) control line remains at $V_{SS}$. The select gate drain (SGD) line is biased at the supply voltage plus a voltage offset α just prior to the program enabling.

At the time of program enabling, the control gate for the selected memory cell 505 is biased at $V_{PGM}$ while the source and the SGD line are biased at the supply voltage (e.g., $V_{CC}$). Control gates CG0, 2, 3, 5, 6, 8-10, and 12-15 coupled to unselected memory cells are biased at a program pass voltage $V_{pass\_prog}$. The program pass voltage turns the memory cells on enough to act in a pass through mode.

At least two cut-off memory cells 506, 507 are used on the drain side of the selected memory cell 505 between the selected memory cell 505 and the bit line to provide the local self-boost to the selected memory cell's 505 local channel. The control gates CG7 and CG11 that are coupled to the cut-off memory cells 506, 507 are biased at a cut-off voltage (e.g., $V_{SS}$) so that these memory cells 506, 507 are inhibited (e.g., turned off) during the programming operation. The cut-off memory cells 506, 507 act to reduce the capacitance on the drain side of the series string that is closest to the selected memory cell 505 by splitting the total capacitance into smaller areas. This has the effect of boosting the local channel voltage $V_0$ of the selected memory cell channel to be greater than both unselected memory cell channel voltages $V_1$ and $V_2$.

In one embodiment, a cut-off memory cell 508 is also used on the source-side of the selected memory cell 505. In this embodiment, the control gate CG1 is also biased at a cut-off voltage (e.g., $V_{SS}$) so that this memory cell 508 is inhibited (e.g., turned off) during the programming operation.

Figure 7:
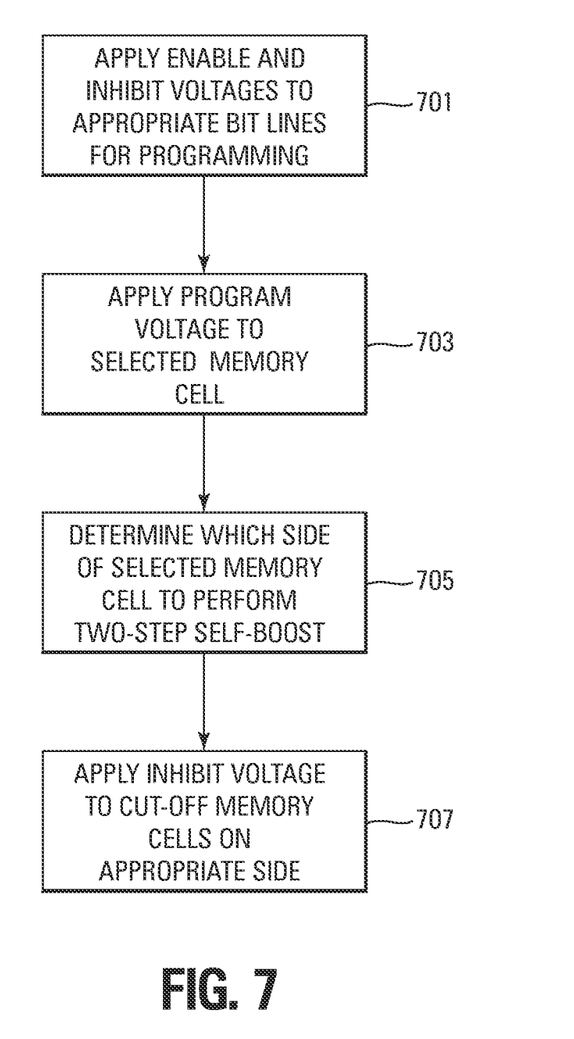
FIG. 7 shows a flowchart of one embodiment of a method for local self-boost using two cut-off memory cells on a single side of a selected memory cell.

FIG. 7 illustrates a flowchart of one embodiment of a method for using at least two cut-off memory cells on a single side of a selected memory cell. The appropriate bit lines are biased according to the operation to be performed 701. In one embodiment, alternate bit lines are inhibited and, thus, biased at an inhibit voltage (e.g., $V_{CC}$) and the other alternate bit lines are biased at an enable voltage (e.g., $V_{SS}$).

A programming voltage is applied to the control gate of a selected memory cell 703. The location of the selected memory cell with reference to the source and the bit line, in a series string of memory cells, is determined 705. The location of the selected memory cell determines whether and/or where the at least two cut-off memory cells are used (e.g., source-side or drain-side). For example, if the selected memory cell is closer to the bit line in the series string, the at least two cut-off memory cells may be on the source side of the selected memory cell. If the selected memory cell is closer to the source in the series string, the at least two cut-off memory cells may be on the drain side of the selected memory cell. The side of the selected memory cell that has the greatest channel capacitance adjacent to the selected memory can be the side on which the at least two cut-off memory cells are used.

The cut-off voltage (e.g., $V_{SS}$) is then applied to the control gates of the cut-off memory cells on the appropriate side of the selected memory cell 707. The cut-off voltage can be any voltage that turns off the cut-off memory cells so that their channels are not conducting and/or creating a channel capacitance.

Figure 8:
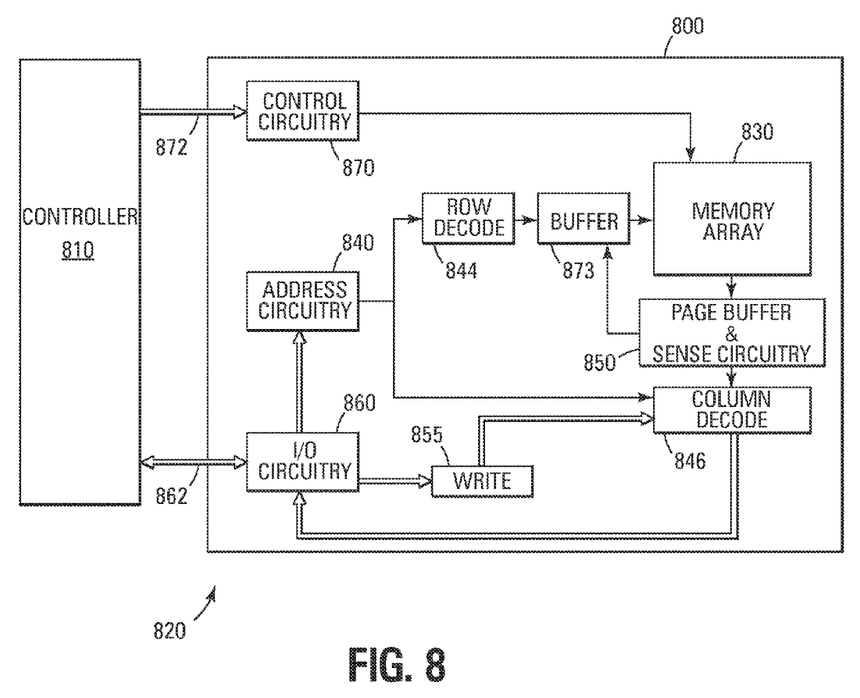
FIG. 8 shows a block diagram of one embodiment of a system that can incorporate a memory device using local self boost using two cut-off memory cells on a single side of a selected memory cell.

FIG. 8 illustrates a functional block diagram of a memory device 800 that can comprise a memory array architecture, such as illustrated in FIG. 2. The memory device 800 is coupled to an external controller 810 or other external circuitry. The external controller 810 may be a microprocessor or some other type of controller. The memory device 800 and the external controller 810 form part of a system 820.

The memory device 800 includes an array 830 of memory cells (e.g., NAND architecture non-volatile memory cells). The memory array 830 is arranged in banks of word line rows and bit line columns. In one embodiment, the columns of the memory array 830 comprise series strings of memory cells.

Address buffer circuitry 840 is provided to latch address signals provided through I/O circuitry 860. Address signals are received and decoded by a row decoder 844 and a column decoder 846 to access the memory array 830. A row buffer 873 can be used to buffer data prior to input to the memory array 830.

The memory device 800 reads data in the memory array 830 by sensing voltage or current changes in the memory array columns using sense circuitry/page buffers 850. The sense circuitry 850, in one embodiment, is coupled to read and latch a row of data from the memory array 830. The sense circuitry 850, as previously described, includes the sense circuitry as well as other circuits (e.g., page buffers) for performing a program verify operation. Data are input and output through the I/O circuitry 860 for bidirectional data communication as well as the address communication over a plurality of data connections 862 with the controller 810. Write circuitry 855 is provided to write data to the memory array.

An internal memory controller (e.g., control circuitry and/or firmware) 870 decodes signals provided on a control interface 872 from the external controller 810. These signals are used to control the operations on the memory array 830, including data read, data write (program), and erase operations. The internal control circuitry 870 may be a state machine, a sequencer, or some other type of control circuitry that is configured to control generation of memory control signals. In one embodiment, the internal control circuitry 870 is configured to control the biasing, during programming of a selected memory cell, of the cut-off memory cells that accomplish the two-step local self-boost.

The memory device illustrated in FIG. 8 has been simplified to facilitate a basic understanding of the features of the memory. A more detailed understanding of internal circuitry and functions of flash memories are known to those skilled in the art.

CONCLUSION

In summary, one or more embodiments of the method for local self-boost using at least two cut-off memory cells to reduce the channel capacitance adjacent to a selected memory cell being program inhibited. The at least two cut-off memory cells divide up the channel capacitance such that only a small capacitance remain immediately adjacent to the selected memory cell channel.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method of operating a memory during a programming operation, comprising:
    biasing a control gate of a selected memory cell of a string of memory cells with a programming voltage sufficient to change a threshold voltage of a memory cell selected for programming during the programming operation;
    biasing a control gate of a first unselected memory cell of the string of memory cells with a voltage configured to turn off the first unselected memory cell;
    biasing a control gate of a second unselected memory cell of the string of memory cells with a voltage configured to turn off the second unselected memory cell;
    biasing control gates of at least one third unselected memory cell of the string of memory cells between the first unselected memory cell and the selected memory cell with voltages configured to turn on each third unselected memory cell; and
    biasing control gates of at least one fourth unselected memory cell of the string of memory cells between the first unselected memory cell and the second unselected memory cell with voltages configured to turn on each fourth unselected memory cell;
    wherein the first unselected memory cell is between a particular end of the string of memory cells and the selected memory cell; and
    wherein the second unselected memory cell is between the particular end of the string of memory cells and the first unselected memory cell.

2. The method of claim 1, further comprising:
    biasing a control gate of a fifth unselected memory cell of the string of memory cells with a voltage configured to turn off the fifth unselected memory cell; and
    biasing control gates of at least one sixth unselected memory cell of the string of memory cells between the fifth unselected memory cell and the selected memory cell with voltages configured to turn on each sixth unselected memory cell;
    wherein the fifth unselected memory cell is between the selected memory cell and an other end of the string of memory cells opposite the particular end of the string of memory cells.

3. The method of claim 2, further comprising:
    biasing control gates of remaining memory cells of the string of memory cells with voltages configured to turn on each remaining memory cell.

4. The method of claim 1, further comprising:
    wherein biasing the control gates of the first unselected memory cell and the second unselected memory cell comprises biasing those control gates to a first voltage less than a supply voltage;
    wherein biasing the control gates of each third unselected memory cell and each fourth unselected memory cell comprises biasing those control gates to a second voltage greater than the supply voltage; and
    wherein biasing the control gate of the selected memory cell to the programming voltage comprises biasing that control gate to a third voltage greater than the second voltage.

5. The method of claim 4, wherein the supply voltage is Vcc and wherein biasing control gates to the first voltage comprises biasing those control gates to Vss.

6. The method of claim 4, further comprising:
    biasing a data line selectively connected to an end of the string of memory cells opposite the particular end of the string of memory cells to a voltage configured to inhibit programming of the selected memory cell.

7. The method of claim 2, further comprising:
    wherein biasing the control gates of the first unselected memory cell, the second unselected memory cell and the fifth unselected memory cell comprises biasing those control gates to a first voltage less than a supply voltage;
    wherein biasing the control gates of each third unselected memory cell, each fourth unselected memory cell and each sixth unselected memory cell comprises biasing those control gates to a second voltage greater than the supply voltage; and
    wherein biasing the control gate of the selected memory cell to the programming voltage comprises biasing that control gate to a third voltage greater than the second voltage.

8. The method of claim 7, further comprising biasing control gates of remaining memory cells of the string of memory cells with the second voltage.

9. The method of claim 8, further comprising:
    biasing a data line selectively connected to the particular end of the string of memory cells to a voltage configured to inhibit programming of the selected memory cell.

10. The method of claim 9, wherein the voltage configured to inhibit programming of the selected memory cell is the supply voltage.

11. The method of claim 10, further comprising:
    biasing an adjacent data line selectively connected to an adjacent string of memory cells to the first voltage.

12. The method of claim 9, further comprising:
    biasing a source selectively connected to an end of the string of memory cells opposite the particular end of the string of memory cells to the supply voltage.

13. The method of claim 1, wherein the particular end of the string of memory cells is located in a position selected from the group consisting of between the selected memory cell and a data line selectively connected to the particular end of the string of memory cells and between the selected memory cell and a source selectively connected to the particular end of the string of memory cells.

14. A method of operating a memory during a programming operation, comprising:
    biasing a control gate of a selected memory cell of a string of memory cells with a programming voltage sufficient to change a threshold voltage of a memory cell selected for programming during the programming operation;
    biasing a control gate of a first unselected memory cell of the string of memory cells with a voltage configured to turn off the first unselected memory cell;
    biasing a control gate of a second unselected memory cell of the string of memory cells with a voltage configured to turn off the second unselected memory cell;

biasing control gates of remaining memory cells of the string of memory cells with voltages configured to turn on each remaining memory cell;

wherein the first unselected memory cell is between a particular end of the string of memory cells and the selected memory cell;

wherein the second unselected memory cell is between the particular end of the string of memory cells and the first unselected memory cell; and wherein at least one of the remaining memory cells is between the first unselected memory cell and the second unselected memory cell.

15. The method of claim 14, wherein the particular end of the string of memory cells is between the selected memory cell and a source selectively connected to the particular end of the string of memory cells.

16. The method of claim 15, wherein the string of memory cells comprises a plurality of memory cells between the first unselected memory cell and the second unselected memory cell.

17. A method of operating a memory during a programming operation, comprising:

biasing a control gate of a selected memory cell of a string of memory cells with a programming voltage sufficient to change a threshold voltage of a memory cell selected for programming during the programming operation;

biasing a control gate of a first unselected memory cell of the string of memory cells with a voltage configured to turn off the first unselected memory cell;

biasing a control gate of a second unselected memory cell of the string of memory cells with a voltage configured to turn off the second unselected memory cell;

biasing a control gate of a third unselected memory cell of the string of memory cells with a voltage configured to turn off the third unselected memory cell;

biasing control gates of remaining memory cells of the string of memory cells with voltages configured to turn on each remaining memory cell;

wherein the first unselected memory cell is between a particular end of the string of memory cells and the selected memory cell;

wherein the second unselected memory cell is between the particular end of the string of memory cells and the first unselected memory cell;

wherein the third unselected memory cell is between the selected memory cell and an end of the string of memory cells opposite the particular end of the string of memory cells; and wherein at least one of the remaining memory cells is between the first unselected memory cell and the second unselected memory cell.

18. The method of claim 17, wherein the particular end of the string of memory cells is between the selected memory cell and a data line selectively connected to the particular end of the string of memory cells.

19. A method of operating a memory during a programming operation, comprising:

biasing a control gate of a selected memory cell of a string of memory cells with a programming voltage sufficient to change a threshold voltage of a memory cell selected for programming during the programming operation;

biasing a control gate of a first unselected memory cell of the string of memory cells with a voltage configured to turn off the first unselected memory cell;

biasing a control gate of a second unselected memory cell of the string of memory cells with a voltage configured to turn off the second unselected memory cell;

biasing a control gate of a third unselected memory cell of the string of memory cells with a voltage configured to turn off the third unselected memory cell;

biasing control gates of remaining memory cells of the string of memory cells with voltages configured to turn on each remaining memory cell;

wherein the first unselected memory cell is between a particular end of the string of memory cells and the selected memory cell;

wherein the second unselected memory cell is between the particular end of the string of memory cells and the first unselected memory cell;

wherein the third unselected memory cell is between the selected memory cell and an end of the string of memory cells opposite the particular end of the string of memory cells;

wherein the particular end of the string of memory cells is between the selected memory cell and a data line selectively connected to the particular end of the string of memory cells; and wherein the string of memory cells comprises a plurality of memory cells between the selected memory cell and the first unselected memory cell, a plurality of memory cells between the first unselected memory cell and the second unselected memory cell, and a plurality of memory cells between the selected memory cell and the third unselected memory cell.

20. The method of claim 17, further comprising:

biasing a data line selectively connected to the particular end of the string of memory cells to a particular voltage configured to inhibit programming of the selected memory cell while receiving the programming voltage; and biasing a source selectively connected to an end of the string of memory cells opposite the particular end of the string of memory cells to the particular voltage.

* * * * *